US008839540B2

(12) United States Patent
Gordon

(10) Patent No.: US 8,839,540 B2
(45) Date of Patent: Sep. 23, 2014

(54) DIGITAL FRAME COVER AND DECORATIVE WRAP

(71) Applicant: Tonia L. Gordon, College Park, GA (US)

(72) Inventor: Tonia L. Gordon, College Park, GA (US)

(*) Notice: Subject to any disclaimer, the term of this patent is extended or adjusted under 35 U.S.C. 154(b) by 0 days.

(21) Appl. No.: 13/706,883

(22) Filed: Dec. 6, 2012

(65) Prior Publication Data

US 2014/0159557 A1 Jun. 12, 2014

(51) Int. Cl.
*A47G 1/06* (2006.01)
*H05K 5/02* (2006.01)

(52) U.S. Cl.
CPC ............ *H05K 5/0239* (2013.01); *A47G 1/0616* (2013.01)
USPC ................................ 40/798; 40/729; 150/165

(58) Field of Classification Search
CPC ............................... A47G 1/06; A47G 1/0616
USPC ............... 40/798, 799, 729; 428/14; 150/165
See application file for complete search history.

(56) References Cited

U.S. PATENT DOCUMENTS

| 6,788,894 | B2 | 9/2004 | Suzuki et al. |
| D545,782 | S | 7/2007 | Schiller et al. |
| 2004/0150943 | A1* | 8/2004 | Rock .............................. 361/681 |
| 2006/0000135 | A1* | 1/2006 | Yoon ............................... 40/799 |
| 2008/0187688 | A1* | 8/2008 | Gunther ........................... 428/13 |
| 2009/0165351 | A1* | 7/2009 | Hsu .................................. 40/799 |
| 2009/0322982 | A1 | 12/2009 | Finnegan |
| 2010/0026915 | A1* | 2/2010 | Pozin et al. .................... 348/838 |
| 2010/0170126 | A1 | 7/2010 | Ye et al. |

* cited by examiner

*Primary Examiner* — Gary Hoge
(74) *Attorney, Agent, or Firm* — J.T. Hollin, Jr., Attorney at Law, P.C.

(57) ABSTRACT

Disclosed is a digital frame cover comprised of two basic components which are utilized in conjunction with each other to decorate the front perimeter of a digital frame. The two primary components of the digital frame cover being (1) a hollow rectangular cover comprising cutouts at various locations, and (2) a "decorative wrap" of interior dimensions which allow the decorative wrap to fit snugly over the exterior of the cover. The cover slides/snaps onto the digital frame. The decorative wrap adheres to, or is magnetically attached to the cover. At the user's prerogative, the decorative wrap may be configured to display one or more of a selection of user-selected designs (i.e., wording, pictures, or appliqués).

5 Claims, 4 Drawing Sheets

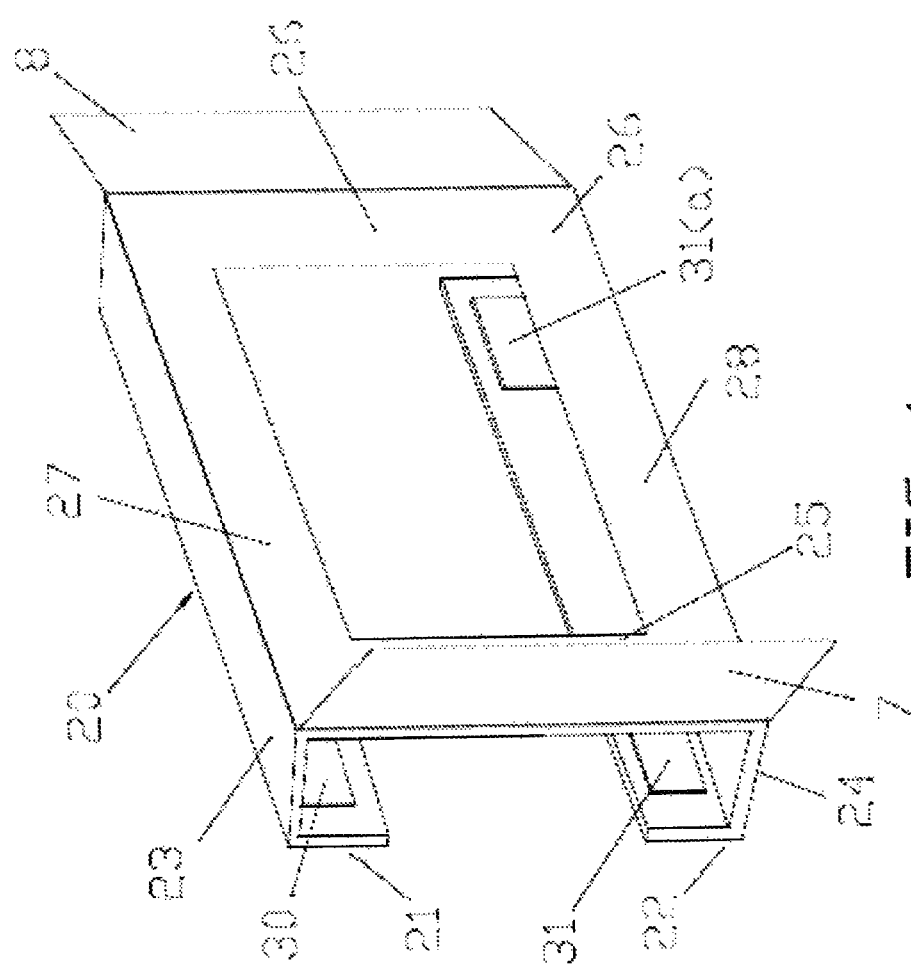
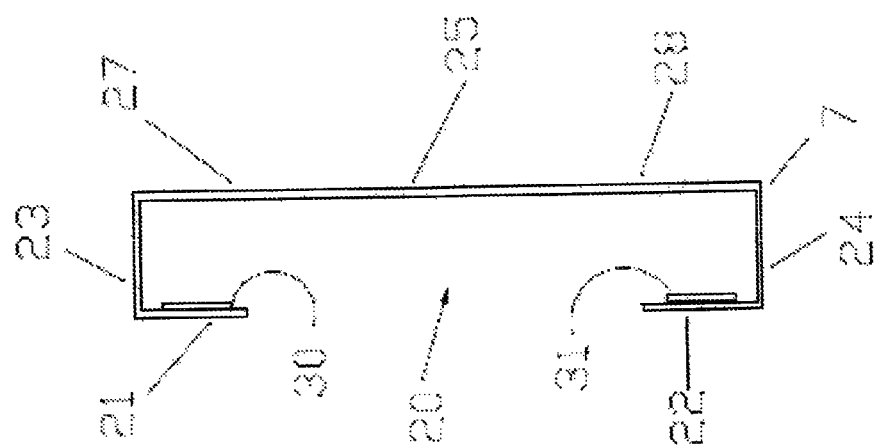

US 8,839,540 B2

DIGITAL FRAME COVER AND DECORATIVE WRAP

CROSS-REFERENCES TO RELATED APPLICATIONS

Not applicable.

STATEMENT REGARDING FEDERALLY SPONSORED RESEARCH OR DEVELOPMENT

Not applicable.

NAMES OF THE PARTIES TO A JOINT RESEARCH AGREEMENT

Not applicable.

REFERENCE TO A "SEQUENCE LISTING," A TABLE, OR A COMPUTER PROGRAM LISTING APPENDIX

Not applicable.

BACKGROUND OF THE INVENTION (1) Field of the Invention

The inventive concept generally applies to protective structures or frameworks for surrounding digital display units, including cameras, video screens, and in particular, digital frames. The inventive device herein, referred to commercially, as "Kover Me," may directly, and snugly, enclose the surrounding perimeter of a digital frame, or similar electronic equipment, and thereby enable a user to apply particular customized decorative elements to the equipment.

(2) Description of the Related Art, including information disclosed under 37 CFR 1.97 and 1.98

US #2010/0170126 A1 (Jul. 8, 2010) A multi-display digital photo frame is provided. The multi-display digital photo frame includes a front cover, a rear cover, and a body. The front cover includes at least two apertures, the body includes at least two holding components for placing LCDs, the bottom of each holding component mounted a LCD further for mounting a processor, wherein the processor is connected to the corresponding LCD through a bus.

U.S. Pat. No. 6,788,894 B2 (Jul. 9, 2004) A digital camera includes an outer casing cover. An open portion is formed in the outer casing cover, and an LCD unit is mounted to the open portion such that the display surface of the LCD unit is exposed to the outside through the open portion. The LCD unit includes a plate-like LCD module of a package type and a mounting frame having the LCD mounted thereto. The mounting frame is formed of a thin member such as a thin metal plate, and the holding frame for housing and holding the display element includes a display frame covering the peripheral portion of the display surface. The display surface and the display frame are exposed to the outside through the open portion of the outer casing member.

US #2009/0322982 A1 (Dec. 31, 2009) A digital media apparatus, such as a digital frame, includes a LCD display having a front surface, electrical components that are connected to the LCD to provide images on the LCD, a glass border surrounding the LCD display, and a frame surrounding the LCD display and the glass border. A first portion of the glass border is opaque in order to conceal the electrical components. A second portion of the glass border is clear. The second portion of the glass border surrounds the first portion of the glass border to provide a visual effect of the LCD and second portion floating within the digital media apparatus.

U.S. #D545,782 S (Jul. 3, 2007) The ornamental design for a frame for graphical display, is shown and described.

JP2010164615 (A) (Jul. 29, 2010) The upper device (2) of a slide type housing includes: two glass plates disposed between a screen (6) and a rear case (12) which is opposite a lower device (3), the upper device further includes two-glass part (7) corresponding to screen areas (10, 11) of a display mechanism; one-glass part (8) which is a part extending from the glass plate of one of the two-glass part and on which the driver (9) of the display mechanism is mounted; a cushioning part (5) disposed between the two-glass part and the screen and forming a space between the screen and driver; and a projecting portion (14) disposed so as to be symmetrical with respect to the cushioning part via the two-glass part and projecting toward the lower device from the rear case.

US2005200737 (A1) (Sep. 15, 2005) A protective structure for a display unit including the display unit for displaying an image, and a plate-like protective member disposed at a side of a surface of the display unit on which the image is displayed for protecting the display surface of the display unit, wherein the protective member is directly fixed to the display unit

BRIEF SUMMARY OF THE INVENTION

"Kover-Me" is the marketing name for a casing created and custom-designed to enclose a digital frame, which is an electronic consumer device. The casing, in its entirety, is referred to as a digital frame cover, which serves to facilitate functioning as an ornamental decoration. The decorative frame cover can be constructed to enclose and decorate digital frames of all dimensions, i.e., 6", 8", 10", 15". The digital frame cover will be manufactured in different embodiments, including a variety of ways to operate the side doors component of the inventive concept.

The device disclosed comprises multiple components which are used to decorate a digital frame. The two primary components are (1) a hollow rectangular box, or cover comprising cutouts at various locations, and (2) a "decorative wrap" of interior dimensions which allows the decorative wrap to fit snugly over the exterior of the cover. The cover slides/snaps onto the digital frame. The decorative wrap adheres, by means of magnetic attraction, adhesive material, or other forms of attachment, to the cover. At the user's prerogative, the decorative wrap may display one or more of a selection of user-selected designs (i.e., wording, pictures or appliques). The decorative wrap and the decorative components may use a removable and reusable adhesive/magnet to secure the decorative wrap to the cover. The Kover-Me commercial components are produced in multiple sizes in accordance with the different sizes of digital frames available to consumers.

BRIEF DESCRIPTION OF THE VIEWS OF THE DRAWINGS

FIG. 4 shows a perspective view of the decorative wrap, having both its side doors open.

FIG. 5 is a left-side view of the decorative wrap of FIG. 4.

DETAILED DESCRIPTION OF THE INVENTION

The objects, features, and advantages of the concept presented in this application are more readily understood when referring to the accompanying drawings. The drawings, totaling six figures, show the basic components and functions of embodiments and/or methods of use. In the several figures, like reference numbers are used in each figure to correspond to the same component as may be depicted in other figures.

Figure 1:
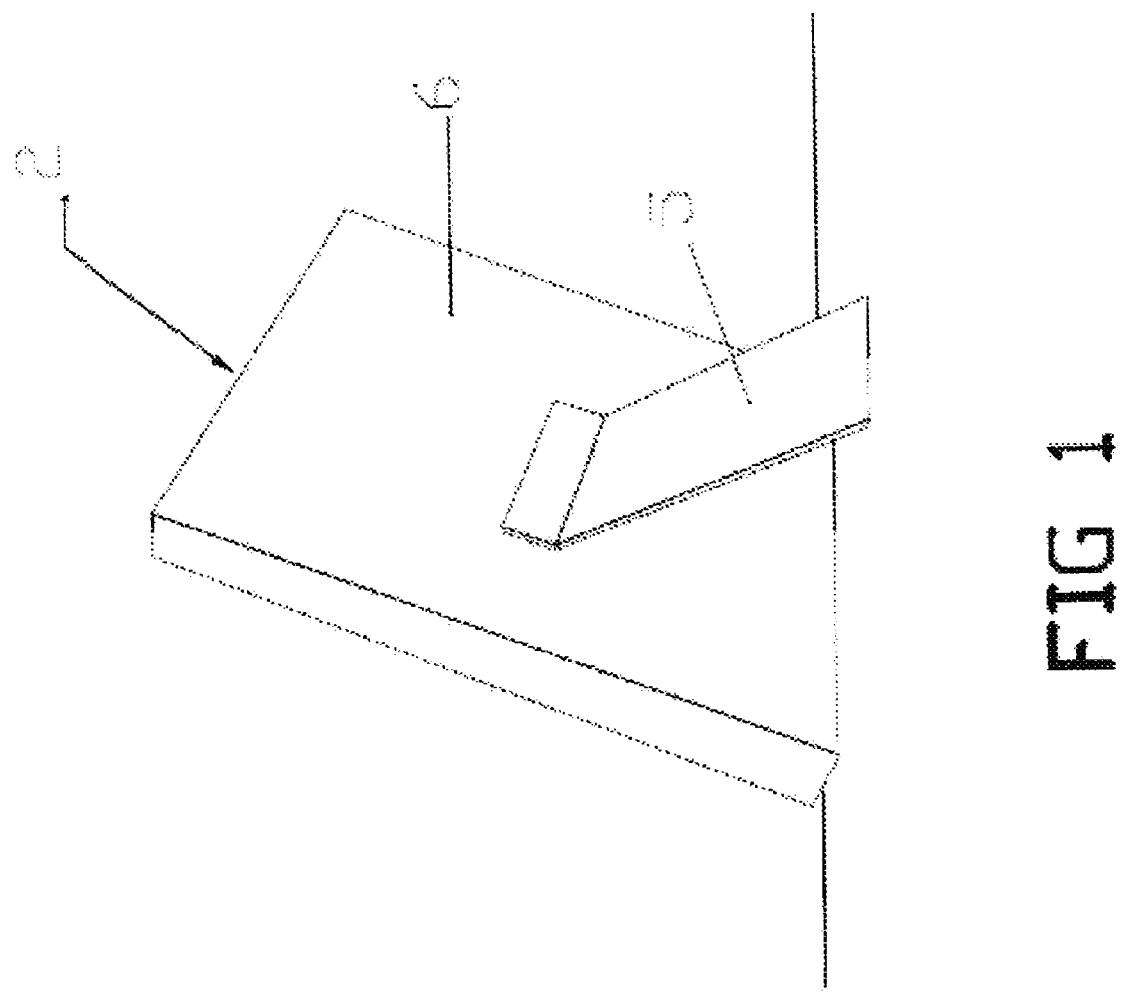
FIG. 1 presents a rear view of a digital frame, supported by its own integral easel back.

The discussion of the present inventive concept is initiated by viewing FIG. 1, which illustrates a rear 6 view of a digital frame 2, supported by its own integral easel back 5. The digital frame 2 shown may be of a variety of sizes, from 5 inches and larger.

Figure 2:
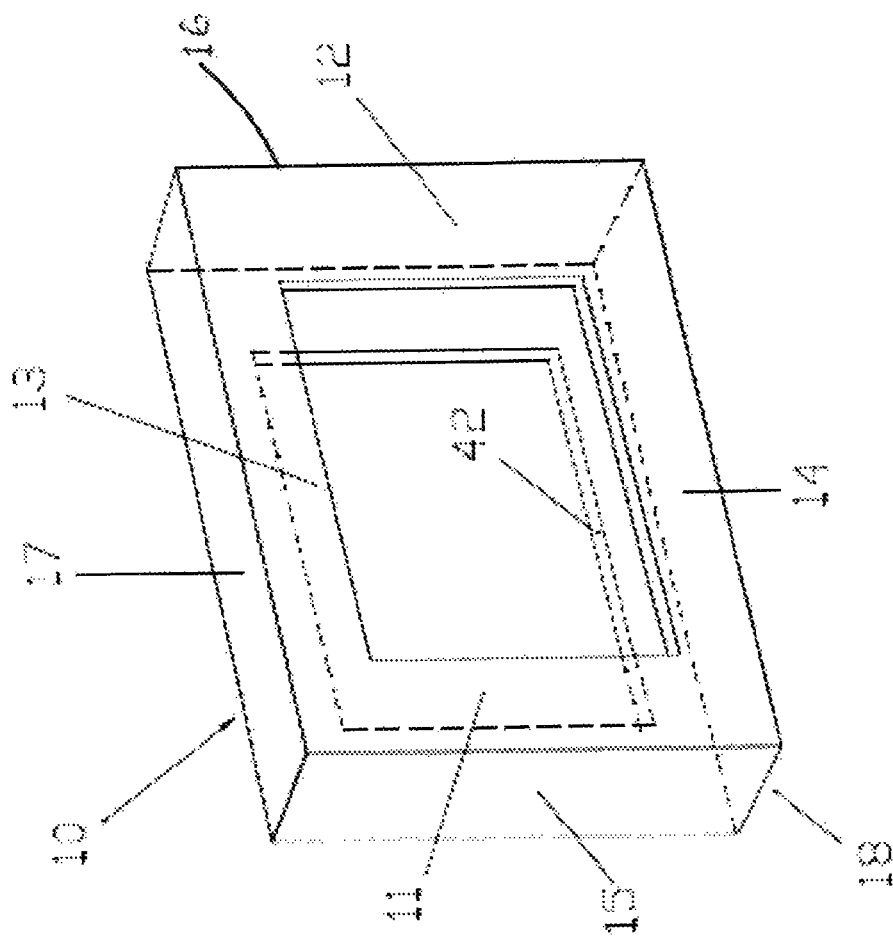
FIG. 2 is a stand-alone view of the cover of the device, which is sized of interior dimensions to fit directly over a digital frame.

FIG. 2 displays a component of the inventive concept, the cover 10. The cover 10 forms essentially a rectangular cuboid, or box-like structure, having six faces, each face of which is either a planar surface or constructed with a particular sized cutout of its surface. The cover 10 of FIG. 1 shows a top surface 17, a right surface 16, a bottom surface 18, and a left surface 15. The two larger-dimensioned faces of the cover 10 are termed the front face and the rear face. The front face of the cover comprises a rectangular opening centered on the front face and of proportional dimensions, thereby forming a left front face 11, a right front face 12, an upper front face 13, and a lower front face 14. Similarly, the rear face of the cover 10 comprises a centered rectangular cutout which forms and upper rear surface 41 (not shown) and a lower rear surface 42.

Figure 3:
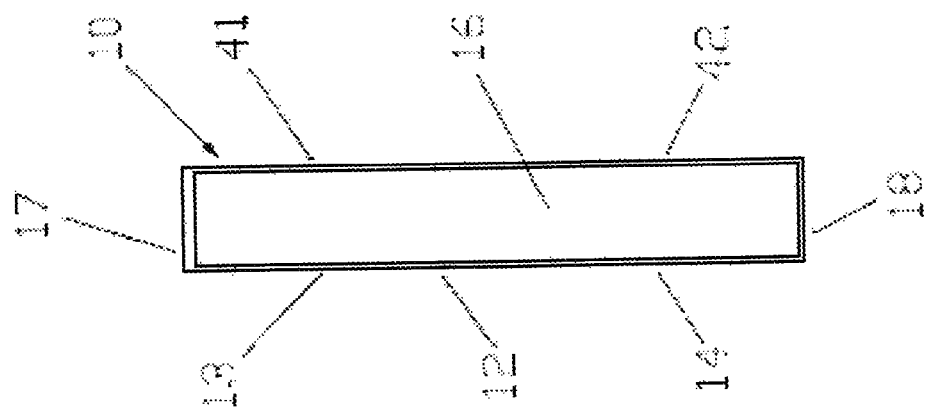
FIG. 3 illustrates a left-side view of the cover of FIG. 2.

As shown in FIG. 2, the cover 10 left, surface 15, top surface 17, and bottom surface 18 are solid surfaces, while the cover 10 right surface 16 is an open space, also designated as the cover opening 16. FIG. 3 displays shows a right-side view of the cover 10. Digital frames 2, which are purchased by substantial numbers of consumers, may be placed in the cover 10 by inserting the left end of the digital fame 2 into the cover opening 16. Once the digital frame 2 is thus inserted, the easel back 5 of the digital frame 2 (shown in FIG. 1) may be rotated outward to allow the assembly of the digital frame 2 and the cover 10 to sit upright on a horizontal surface.

The cover 10 may be constructed from a wide variety of materials, said materials, including, but not limited to, metal, wood, plastic, fiberglass and other substances. The characteristics of the aforementioned materials may be rigid, semi-rigid, or elastomeric. In the embodiment of the cover 10 comprising metallic material, the metal will serve to function to hold in place any decorative elements that may have a magnet or embody magnetic characteristics. An embodiment of the cover 10 may include the attachment of a spring-loaded door to the vertical length of the right front face 12, said door being of dimensions equal to the width of the top surface 17 and the vertical length of the right front face 12.

The second component of the digital frame cover 1 is a decorative wrap 20, which is illustrated in FIG. 4. The decorative wrap 20, similar to the cover 10, forms essentially a rectangular cuboid, or box-like structure, wherein the bottom surface, termed the "bottom plate" 24, and the top surface, termed the "top plate" 23 are solid surfaces. The rear face of the decorative wrap 20 comprises a length-wise rectangular cutout forming a top rear ledge 21, and a bottom rear ledge 22. The front face of the decorative wrapper 20 is characterized by a centered rectangular cutout, said cutout forming a left front surface 25, right front surface 26, top front surface 27, and a rear front surface 25.

At the left front surface 25, there is attached a left door 7 of dimensions corresponding to the vertical length of the left front surface 25 and the width of the top plate 23. Similarly, at the right edge of the decorative wrap 20 is attached a right door 8 of dimensions corresponding to the vertical length of the right front surface 26 and the width of the top plate 23. Both doors, 7, 8, may be attached to their respective front surface 25, 26 by a spring-loaded hinge, elastomeric fitting, or other means of attachment permitting opening of each door 7, 8, yet providing tension in a direction compelling self-closure of each respective door 7, 8. The decorative wrap 20 may be constructed from a wide variety of materials, said materials, including, but not limited to, metal, wood, plastic, fiberglass and other substances. In the embodiment of the decorative wrap 20 comprising metallic material, the metal will serve to function to hold in place any decorative elements that may have a magnet or embody magnetic characteristics. The characteristics of the aforementioned materials may be rigid, semi-rigid, or elastomeric.

As shown in FIG. 4 and FIG. 5, two symmetrically-spaced magnets 31, 31(a) may be embedded in the bottom rear ledge 22 of the decorative wrap 20. Further, two symmetrically-spaced magnets 30, 30(a) (not shown) may be embedded in the top rear ledge 21 of the decorative wrap 20. The magnets serve to hold a cover 10 constructed of metallic material, in a position immediately adjacent to the decorative wrap 20. Similar-sized magnets may also be placed on the inside surface of the upper front surface 27 and/or the inside surface face of the lower front surface 28. The magnets may also serve to attract and hold in position certain types of magnetically-enhanced decorative appliques that a user may place on any of the four front surfaces 25, 26, 27, 28, of the decorative wrap 20. In some embodiments of the digital frame cover 1, an adhesive-type surface, or a hook-and-felt fastening mechanism may comprise the front surfaces 25, 26, 27, 28 of the cover 10 or of the decorative wrap 20 of the inventive device.

Figure 6:
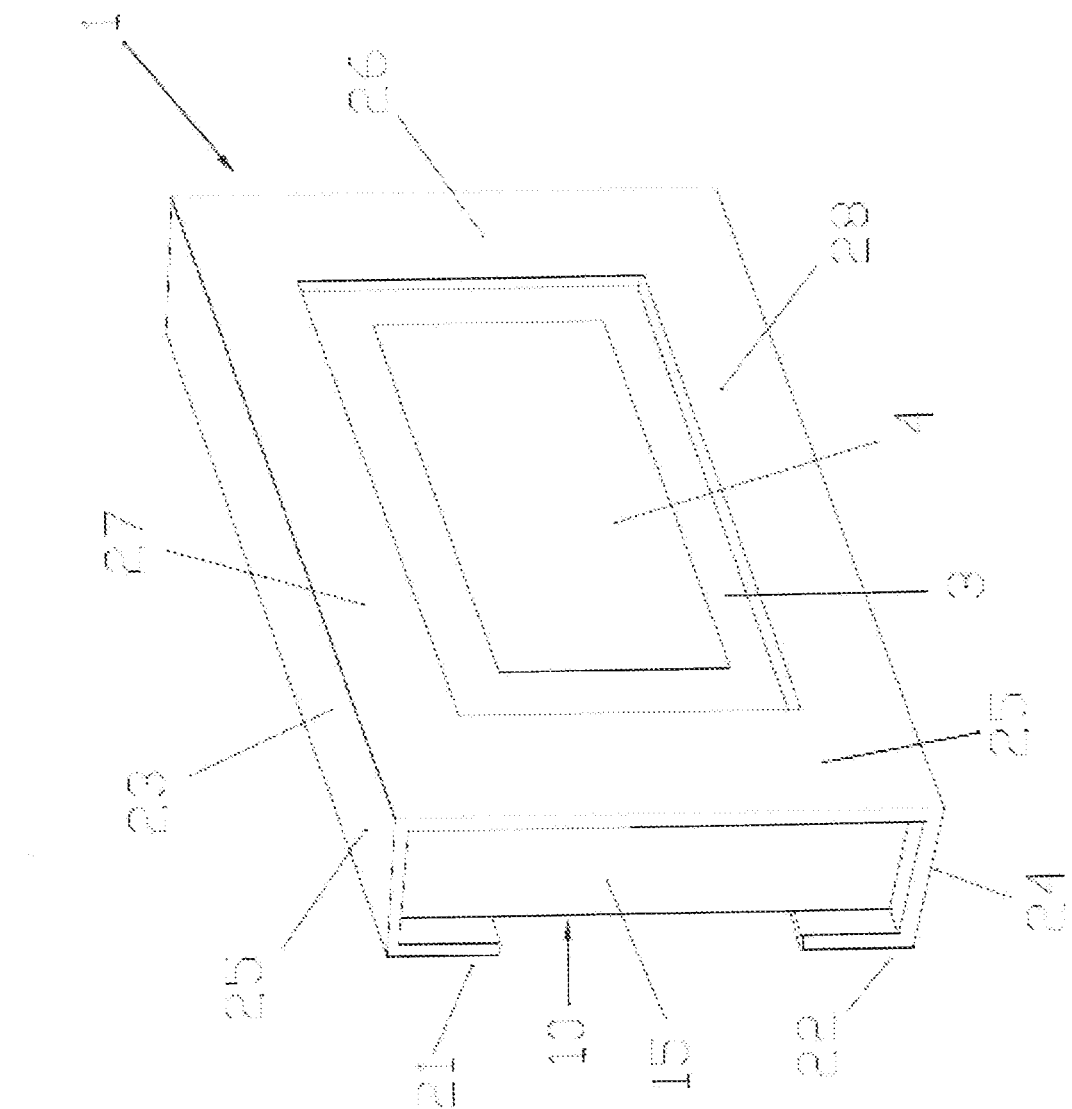
FIG. 6 displays the complete assemblage of the digital frame cover enclosing a digital frame, absent a left side door.

FIG. 5 illustrates a left-side view of the decorative wrap 20. FIG. 6 displays the complete assemblage of the digital frame cover 1 surrounding the screen 3 of a digital frame 2. In FIG. 6, the left door 7 of the decorative wrap cover 10 has been deleted from the drawing in order to expose a better view of the cover 10, in relation to the entire digital frame cover 1. As pointed out earlier, at the user's prerogative, the decorative wrap 20 may display one or more of a selection of user-selected designs (i.e., wording, pictures or appliqués). The decorative wrap 20 and the decorative components may use a removable and reusable adhesive material, or a magnet to secure the selected designs to the decorative wrap 20.

An embodiment of the decorative wrap 20 permits the attachment of decorative appliqués to any portion of the front faces 25, 26, 27, 28 of the decorative wrap 20. The decorative appliqués are maintained on the desired front faces by means of adhesive backing or by means of metallic backing on the appliqués themselves. The appliqués may be selected from an unlimited variety of design ideas, including, but not limited to, common life events, holidays, sporting events, sorority affiliation, fraternity affiliation, professional association, vacation event, family members, children's interests, popular sayings, entertainment media, religious, and miscellaneous design/décor. The Kover-Me components, the cover 10 and the decorative wrap 20 are produced in multiple sizes in accordance with the different sizes of digital frames available to consumers.

Upon purchase by a consumer, of the inventive concept, the initial packaging will include a cover 10 and a decorative wrap 20. The user must then insert the subject digital frame 2, or other similar electronic device, into the cover 10 through opening 16. If the cover 10 is constructed with a door at the opening 16, the door must be closed, and afterwards, the decorative wrap 20 may be securely placed over the exterior of the cover 10. In some embodiments, the digital frame cover 1 may comprise a decorative wrap 10 having an integral design element or decorative trim permanently affixed to the front face(s) of the decorative wrap 10. In the case where temporarily-attached decorative elements are utilized, the consumer may remove the existing decorative material and replace same with same differently-styled decorative elements, dependent on the nature of the subject matter desired to be displayed on the digital frame 2.

While preferred embodiments of the present inventive concept have been shown and disclosed herein, it will be obvious to those persons skilled in the art that such embodiments are presented by way of example only, and not as a limitation to the scope of the inventive concept. Numerous variations, changes, and substitutions may occur or be suggested to those skilled in the art without departing from the intent, scope, and totality of this inventive concept. Such variations, changes, and substitutions may involve other features which are already known, per se and which may be used instead of in combination with, or in addition to features already disclosed herein. Accordingly, it is intended that this inventive concept be inclusive of such variations, changes, and substitutions, and by no means limited by the scope of the claims presented herein.

What is claimed is:

1. A device for the enhancement and enjoyment of electronic images, which images are displayed on a digital frame of the type having a screen enclosed in a structure normally having a back easel, said device comprising:

a cover comprising an essentially rectangular box-like container, having a top face, a right face, a bottom face, a left face, a front face, and a rear face, wherein the top face is a solid surface, the right face comprises an opening, the bottom face comprises a solid surface, the left face comprises a solid surface; the front face comprises a centered rectangular opening forming a planar border about the perimeter of said rectangular opening; and the rear face comprises a cross-wise opening forming an upper, horizontal lengthwise ledge and a lower lengthwise horizontal lengthwise ledge, and a decorative wrap comprising an essentially rectangular box-like container, having a top face, a right face, a bottom face, a left face, a front face, and a rear face, wherein the top face is a solid surface, the left face comprises a door rotatably attached to the left edge of said front face; the right face comprises a door rotatably attached to the right edge of said front face; the front face comprises a centered rectangular opening forming a planar border about the perimeter of said rectangular opening; and the rear face comprises a centered rectangular opening forming a planar border about the perimeter of said rectangular opening, wherein said cover is of interior dimensions allowing the slidable placement of the cover over the exterior surfaces of the digital frame, and said decorative wrap is of interior dimensions allowing the slidable placement of the decorative wrap over the entirety of the exterior surface of said cover.

2. A device for enabling the attachment and display of at least one removable or permanently attached decorative element to the immediate perimeter of a digital frame of the type having a screen enclosed in a structure normally having a back easel, said device comprising:

a cover comprising an essentially rectangular box-like container, having a top face, a right face, a bottom face, a left face, a front face, and a rear face, wherein the top face is a solid surface, the right face comprises an opening, the bottom face comprises a solid surface, the left face comprises a solid surface; the front face comprises a centered rectangular opening forming a planar border about the perimeter of said rectangular opening; and the rear face comprises a cross-wise opening forming an upper, horizontal lengthwise ledge and a lower lengthwise horizontal lengthwise ledge, and a decorative wrap comprising an essentially rectangular box-like container, having a top face, a right face, a bottom face, a left face, a front face, and a rear face, wherein the top face is a solid surface, the left face comprises a door rotatably attached to the left edge of said front face; the right face comprises a door rotatably attached to the right edge of said front face; the front face comprises a centered rectangular opening forming a planar border about the perimeter of said rectangular opening; and the rear face comprises a centered rectangular opening forming a planar border about the perimeter of said rectangular opening, wherein said cover is of interior dimensions allowing the slidable placement of the cover over the exterior surfaces of the digital frame, and said decorative wrap is of interior dimensions allowing the slidable placement of the decorative wrap over the entirety of the exterior surface of said cover.

3. A device as in either of claim 1 or claim 2, wherein a spring-loaded door is attached to the opening of the right side of the cover, such as to cause said door to revolve about a vertical axis defined by the junction of the door length and the edge of the right side of the cover.

4. A device as in either of claim 1 or claim 2 wherein a decorative element may be temporarily attached to any portion of the front face of the decorative wrap, said decorative element designed and related to the display of matters connected with any one of a group of categories consisting of life events, holidays, sporting events, sorority affiliation, fraternity affiliation, professional association, vacation event, family members, children's interests, popular sayings, entertainment media, religious, and miscellaneous design/décor.

5. A device as in either of claim 1 or claim 2 wherein the decorative wrap comprises a permanently affixed textual, visual, or specially-designed element permanently affixed to the front face or faces of said decorative wrap.

* * * * *